United States Patent
Miller et al.

(10) Patent No.: US 6,287,987 B1
(45) Date of Patent: Sep. 11, 2001

(54) METHOD AND APPARATUS FOR DEPOSITION OF POROUS SILICA DIELECTRICS

(75) Inventors: Gayle W. Miller; Gail D. Shelton, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/302,832

(22) Filed: Apr. 30, 1999

(51) Int. Cl.⁷ .................................................. H01L 21/31
(52) U.S. Cl. ........................ 438/763; 438/761; 438/764; 438/788; 257/632
(58) Field of Search ................... 438/763, 761, 438/624, 788; 257/632; 427/96; 437/195

(56) References Cited

U.S. PATENT DOCUMENTS

| | | | |
|---|---|---|---|
| 5,420,168 | 5/1995 | Mayer et al. | 521/99 |
| 5,470,802 | 11/1995 | Gnade et al. | 437/238 |
| 5,472,502 | 12/1995 | Batchelder | 118/52 |
| 5,525,857 | 6/1996 | Gnade et al. | 313/309 |
| 5,561,318 | 10/1996 | Gnade et al. | 257/638 |
| 5,661,344 | 8/1997 | Havemann et al. | 257/758 |
| 5,670,210 | 9/1997 | Mandal et al. | 427/240 |
| 5,705,232 | 1/1998 | Hwang et al. | 427/512 |
| 5,716,673 | 2/1998 | Yen et al. | 427/240 |
| 5,723,368 | * 3/1998 | Cho et al. | 437/763 |
| 5,736,425 | 4/1998 | Smith et al. | 438/778 |
| 5,744,378 | * 4/1998 | Homma | 437/195 |
| 5,789,819 | 8/1998 | Gnade et al. | 257/759 |
| 5,801,092 | 9/1998 | Ayers | 438/623 |
| 5,807,607 | 9/1998 | Smith et al. | 427/96 |
| 5,847,443 | * 12/1998 | Cho et al. | 257/632 |
| 5,866,476 | * 2/1999 | Choi et al. | 438/624 |
| 5,888,911 | * 3/1999 | Ngo et al. | 438/788 |
| 5,955,140 | * 9/1999 | Smith et al. | 427/96 |
| 6,022,812 | * 2/2000 | Smith et al. | 438/761 |

* cited by examiner

*Primary Examiner*—John F. Niebling
*Assistant Examiner*—Olivia Luk

(57) ABSTRACT

A method and apparatus for forming a dielectric layer. A dielectric precursor solution is deposited onto a surface of a substrate. The substrate is spun to spread the dielectric precursor solution over the surface of the substrate. A catalyst is introduced through a filter, wherein the filter causes a substantially homogenous distribution of the catalyst within the substrate, wherein a dielectric layer forms containing pores and wherein a solvent is contained in the pores. The solution is dried to form the dielectric layer using a carrier gas after introducing the catalyst, wherein the carrier gas places a positive pressure within the pores while removing the solvent to form a low-k dielectric layer.

25 Claims, 2 Drawing Sheets

METHOD AND APPARATUS FOR DEPOSITION OF POROUS SILICA DIELECTRICS

BACKGROUND OF THE INVENTION

1. Technical Field

The present invention relates to an improved manufacturing semiconductor device, and, in particular, to a method and apparatus for depositing dielectrics on a semiconductor substrate. Still more particularly, the present invention relates to a method and apparatus for depositing and processing low dielectric aerogel films on a semiconductor substrate.

2. Description of the Related Art

Semiconductor devices are widely used in integrated circuits to create microprocessors and other devices for use in products, such as computers, cellular phones, televisions, and automobiles. These integrated circuits typically contain transistors on a single silicon chip to perform various functions and to store data.

Integrated circuits have continued to shrink in size and increase in complexity with each new generation of devices. As a result, integrated circuits increasingly require very close spacing of interconnect lines. Many integrated circuit designs now include multiple levels of metalization to interconnect the various circuits on the device. The closer spacing of these interconnect lines increases capacitance between adjacent lines. As a consequence, as the device geometry shrinks and densities increase capacitance interference or cross talk between adjacent lines becomes an increasing problem (cross talk is the same as capacitive coupling). It is desirable to shrink the size of the integrated circuits. One reason for decreasing the size is this cross talk effects both limits of achievable speed and degrades the noise margin used to ensure proper operation of the device.

One way to diminish the power consumption and cross talk effects in integrated circuits is to decrease the dielectric constant of the insulator or dielectric separating the conductors in the lines. The most common semiconductor dielectric is silicon dioxide, which has a dielectric constant (k) of about 3.9. In contrast, air has a dielectric constant of just over 1.0. As a result, it becomes more desirable to use lower dielectric materials to offset this problem.

Many of the materials used for producing ultra-low-k dielectric insulators for use in integrated circuits require very specific processing constraints, which are not easily achievable. For example, dielectric layers having porous structure have been employed because it has been recognized that porous dielectric layers having a porosity of generally greater than 50% and in many cases greater than 75% may provide a low dielectric constant insulation for decreasing unwanted capacitive coupling in semiconductor devices. Manufacture of these dielectrics, however, have been difficult because of problems associated with shrinkage during drying of dielectrics. Therefore, it would be advantageous to have an improved method and apparatus for depositing a low-k dielectric material on a semiconductor substrate.

SUMMARY OF THE INVENTION

The present invention provides a method and apparatus for forming a dielectric layer. A silica precursor solution is deposited onto the surface of a substrate. This solution is spread over the surface of the substrate by spinning the substrate. Thereafter, a catalyst is introduced into the substrate by introducing the catalyst through a filter that causes the catalyst to deposit uniformly on the solution and be distributed homogeneously within the silica precursor solution. The solution is aged and dried using a carrier gas in which the carrier gas is used to place a positive pressure on the solvent within the pores.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The processes, steps, and structures described below do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures represent cross sections of a portion of an integrated circuit during fabrication and are not drawn to scale, but instead are drawn so as to illustrate important features of the invention.

Figure 1A:
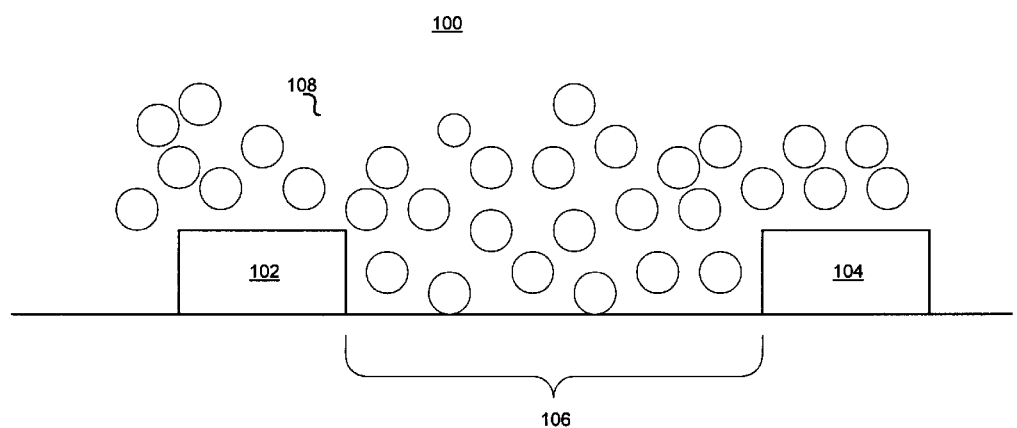
FIGS. 1A–1B are cross-sections of a semiconductor substrate with a dielectric, depicted in accordance with a preferred embodiment of the present invention.
Figure 1B:
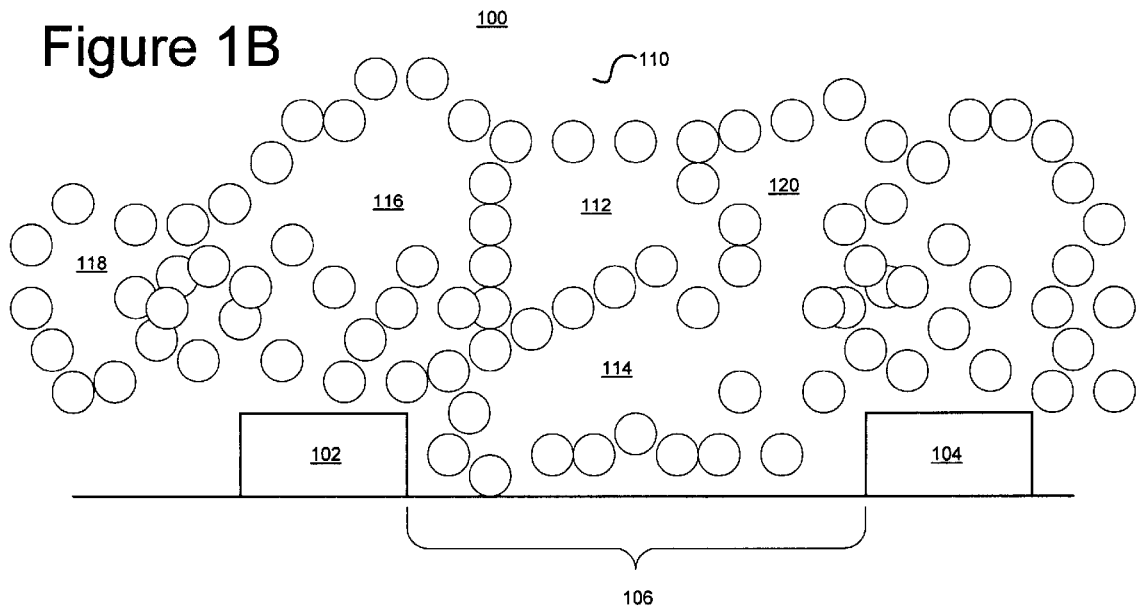

With reference now to FIGS. 1A–1B, cross-sections of a semiconductor substrate with a dielectric, is depicted in accordance with a preferred embodiment of the present invention. In this example, substrate 100 is a silicon substrate including conductors 102 and 104. These conductors are typically separated by a gap 106 of a predetermined width, typically a fraction of a micron. The width and height ratios illustrated in FIGS. 1A and 1B are not to scale. In FIG. 1A, substrate 100 has a precursor silica layer 108 in a wet or liquid form. Precursor silica layer 108 in this example is a tetraethylorthosilicate (TEOS) layer. Although the depicted example employs the use of TEOS, other types of silica precursors may be used in accordance with the preferred embodiment of the present invention. For example, a tetramethylorthosilicate (TMOS) is an example of another silica precursor solution that may be used to form a dielectric layer in accordance with the preferred embodiment of the present invention.

These dielectric layers that are formed from precursor silica layer 108 include a number of pores when processed. In FIG. 1B, film 110 includes pores 112–120, also referred to as capillaries. Acid catalyzed hydrolysis causes the polymer to form chains of silica with alcohol contained (i.e., ethanol) within pores 112–120. In drying precursor silica layer 108, the present invention provides an apparatus to control the drying of TEOS layer 108 to maintain the capillary pressure within the pores to prevent the pores from collapsing.

The equation for this process in the depicted example is as follows: $nSi(OR)_4 \rightarrow n(SiO_2) + ROH$. The TEOS stock may take the form of an Si(OR)$_4$ where R is an ethanol. TEOS layer 108 is deposited on substrate 100 to form an aerogel dielectric layer. The TEOS is a precursor solution for forming aerogel. This aerogel film also may be placed on other substrates other than semiconductor substrates. For example, without limitation, the substrate may be that for a miniaturized chemical sensor, thermal isolation structures, and thermal isolation layers, including thermal isolation structures of infrared detectors.

Substrate 100 may include common substrates for semiconductor devices, such as silicon, germanium, and gallium arsenide. After precursor silica layer 108 has been deposited onto substrate 100, the solvent is evaporated from precursor silica layer 108 to form film 110.

The present invention provides a method and apparatus for creating a low-k dielectric material. As used herein, a low-k dielectric is a material with a dielectric constant less than 2. A catalyst is introduced into the chamber through a distribution mechanism to aid the formation of the porous silica dielectric layer. A catalyst, such as, for example, anhydrous HF may be introduced into the chamber through a distribution mechanism that allows for uniform distribution of the HF gas across the substrate prior to drying of the substrate. The present invention employs an apparatus that provides for controlling the pressure as well as the gasses or vapors introduced into the system. A closed cup system is provided to control the pressure of a gas, such as nitrogen and water vapor, during the creation of a low-k dielectric on a substrate. In this example, nitrogen acts as a carrier gas. Of course, other types of carrier gases may be used depending on the available gases and other processing parameters. The amount of nitrogen may be adjusted with respect to the amount of water vapor to maintain capillary pressure within the capillary and pores formed in the dielectric. A higher nitrogen to vapor ratio is employed as the film dries in accordance with a preferred embodiment of the present invention.

The pores created by the highly branched polymers behave as capillaries filled with a solvent byproduct, such as ethanol from the TEOS. As part of the process of creating an aerogel, it is desirable to minimize capillary forces while drying the film to prevent the pores from collapsing. An aerogel is a porous dielectric material that is 90% air within the dielectric structure. The processes of the present invention include injecting a gas mixture, such as nitrogen and water vapor, or some other solvent vapor, to control the vapor pressure during the drying phase. The nitrogen gas flow into the chamber may be increased while other gasses are decreased to allow the film to dry while retaining its porosity. Although the depicted examples include the use of nitrogen as a carrier gas, other carrier gases may be used in accordance with a preferred embodiment of the present invention.

Figure 2:
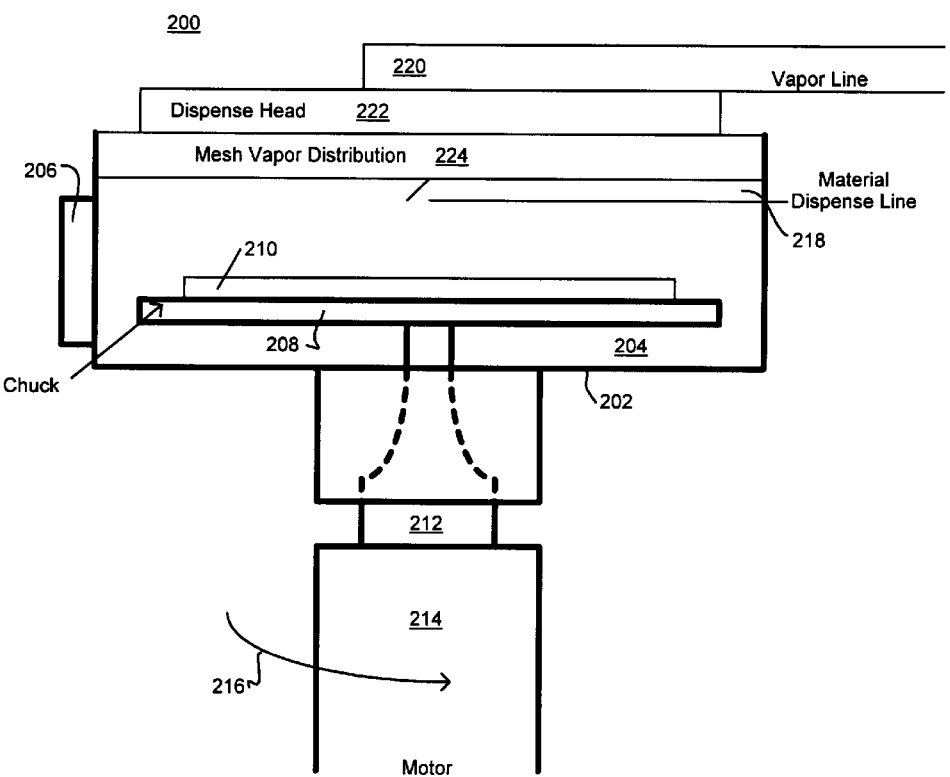
FIG. 2 is a dielectric processing apparatus depicted in accordance with a preferred embodiment of the present invention.

With reference now to FIG. 2, a dielectric processing apparatus is depicted in accordance with a preferred embodiment of the present invention. Closed cup apparatus 200 includes a housing 202 with chamber 204 in which a substrate may be placed through gate or window 206. A chuck 208 is located within chamber 204 on which a substrate 210 is shown. In the depicted example, substrate 210 is a silicon semiconductor wafer. Of course, substrate 210 may be any substrate on which a dielectric, such as that of the present invention, is to be deposited and processed. Chuck 208 is connected to spindle 212, which is also coupled to motor 214. Motor 214 causes chuck 208 to spin in direction 216. In the depicted examples, the spin rate may be from about 1500 revolutions per minute (rpm) to about 5000 rpm depending on the desired film thickness. The spin may be performed from about 5 to about 10 seconds to form the film on the wafer.

A material dispense line 218 is present, which is used to dispense a TEOS solution onto wafer 210. A vapor line 220 provides various gases or vapors to dispense head 222 for introduction to chamber 204 via mesh vapor distribution unit 224. In this example, vapor line 220 is used to provide the catalyst or the carrier gas in accordance with the preferred embodiment of the present invention. Mesh vapor distribution unit 224 provides for an even distribution of the catalyst onto the surface of the substrate, and for a consequent homogeneous distribution of the catalyst within the silica precursor solution.

Substrate 210 is transported to chuck 208 through a variety of tracks through gate 206, after which the chamber closes. The pressure within chamber 204 is controlled by introducing various vapors or gases through dispense head 222 into housing 202 of chamber 204. In accordance with a preferred embodiment of the present invention, a vapor introduced into chamber 204 is a mixture of nitrogen gas and water vapor in which nitrogen is the carrier gas. This vapor is distributed uniformly by using mesh vapor distribution unit 224. In the depicted example, the mesh may be that of Teflon. Teflon is a registered trademark of BI duPont de Nemouris and company. Teflon is an example of polytetrafluoroethylene (PTFE), which is inert to virtually all chemicals and considered a slippery material. Further, the silicon precursor solution to be dispensed onto wafer 210 typically requires the addition of a catalyst, such as, dilute hydrofluoric acid (HF) or ammonium fluoride before the TEOS solution has hydrolyzed. These additions may be required to provide a catalyst to form the silicon matrix of an aerogel. In accordance with a preferred embodiment of the present invention, these catalysts are introduced into the TEOS solution through mesh vapor distribution unit 222. A homogeneous distribution of these catalysts within the silicon precursor solution is provided by mesh vapor distribution unit 222.

This homogeneous distribution within the silica precursor solution results in a more uniformed dielectric layer being manufactured in accordance with the preferred embodiment of the present invention. In such an instance, anhydrous HF may be sent through vapor line 220 into dispense head 222 and mesh vapor distribution unit 224 into cavity 204. Other catalysts that can be used include, for example, Ammonium fluoride, HCL, and HNO$_3$. Ammonium fluoride is a base catalyst, while HCL and HNO$_3$ is an acid catalyst. Of course, other base and acid catalyst may be employed. In this instance, the vapor line 220 should be compatible with the solvents being used.

The drying portion of the process is important to the nanostructure within the film developed on wafer 210. A nanostructure is a physical structure on an atomic level; how atoms are organized to form crystalline or amorphous material in this case. In the depicted examples, the aerogel was illustrated as being formed from a silica precursor solution. Aerogels may be created from a number of different types of materials. For example, organic sol-gels and other silica gels may be used to create an aerogel. Organic sol-gels include resorcihol-formaldehyde and melamine-formaldehyde. Other silica gels include hydrosilsesquioxane, as well as silica-titania complexes. In this example, the nanostructure retains porosity. The nanostructure may be controlled by adjusting the amount of water vapor and nitrogen into the chamber. A higher nitrogen to water vapor ratio may be introduced as the film dries. Similarly, the nitrogen line also may be temperature controlled to allow temperature adjustment within chamber 204 of housing 202. Closed cup apparatus 200 may be implemented using available spin on glass processing equipment with a few modifications. For example, closed cup apparatus 200 may be modified or designed to include mesh vapor distribution unit 224.

The formation of the aerogel in closed cup apparatus 200 is desired to be such that the dielectric properties are preserved. In particular, the dielectric constant should be minimized while increasing the porosity of an aerogel layer. As a TEOS stock solution is catalyzed, the silicon in the TEOS begins to polymerize forming long branched molecules. Dilute HF may be titrated into the TEOS as a catalyst for this process. The uniformity of the dielectric film is dependent upon how the branching takes place when the HF is introduced into the system.

With closed cup apparatus 200 of the present invention, an anhydrous HF gas is injected through mesh vapor distribution unit 224, which is designed to evenly distribute the HF gas across the wafer. As a result, the properties of the dielectric film formed are more uniform. These properties include, for example, the density and the dielectric constant of the film. In addition, this process also improves the adhesion of the dielectric film formed because less stress will occur with a homogeneous nanostructure.

Figure 3:
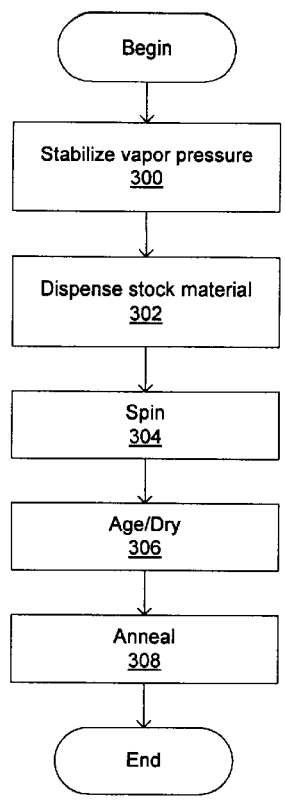
FIG. 3 is a flowchart of a process used to create aerogels depicted in accordance with a preferred embodiment of the present invention.

With reference now to FIG. 3, a flowchart of a process used to create aerogels is depicted in accordance with a preferred embodiment of the present invention. The process begins by stabilizing the vapor pressure within the processing chamber (step 300). Thereafter, the stock material is deposited onto the substrate (step 302). The stock material in the depicted example is a stock TEOS solution. This stock solution may be an organic solution, such as a polyamide or an inorganic stock solution, such as a TEOS solution. This material is dispensed onto the substrate wafer under the stabilized vapor pressure in the processing chamber. Thereafter, the material is spun (step 304). The spinning that takes place is similar to that used for spin on glass.

Next, the material is aged and dried (step 306). This aging and drying may include typical steps used to age and dry aerogels. Thereafter, the substrate is annealed (step 308). The annealing is used for thermal stabilization. Typically, low-k dielectric materials require an annealing step for thermal stabilization. This particular step does not take place within the chamber. Instead, the substrate may be sent to a hotplate or oven used for baking films and semiconductors. The substrate would exit the chamber after the age and dry cycle in step 306 has completed and be transported for an annealing process.

Different gas flow settings, temperature, and process times may be used in closed cup apparatus 200 to achieve the desired dielectric film properties. A typical range for the vapor pressure ($P_v/P_o$) that will maintain optimal pore size is 0.7 to 0.95. This correlates to the capillary pressure 40 Mpa to 100 Mpa. The pressure may vary with the solvent vapor, which is introduced into the gas mixture. Others solvents may be used in the solvent vapor include, for example, water, methanol, IPA, and formaldehyde.

The spin on and drying part of the process typically will occur within a time period of two minutes in accordance with a preferred embodiment of the present invention. The nominal dielectric constant of such a film will have a dielectric constant value of k<1.7. Typical low-k materials range from about 2.0 to about 3.0.

The following is an example of the materials, steps, and processing parameters used to create a dielectric layer in accordance with a preferred embodiment of the present invention: mix 1 mol of TEOS, about 4 to about 20 mols of water containing dilute catalyst (i.e., 0.2% HF). The catalyst introduced into the TEOS is introduced through a vapor distribution unit, such as, mesh vapor distribution unit 224 of FIG. 2 for a period of time of about 5 second in this example. After mixing these ingredients the hydrolysis begins to increase as the pH changes in response to the introduction of the catalyst. No additional additives are needed to change the viscosity. The gelation changes the viscosity as hydrolysis takes place in this example. Storage conditions for these materials prior to mixing should be at about 15° C. to about 20° C. to maintain the stability of the solution until it is used. Temperature changes to the solutions are not required for depositing the solution for use on a wafer.

The wafer then would be spun at a speed of about 1500 revolutions per minute (RPM) to 5000 RPM, depending on the film thickness for about 5–10 seconds. The processing parameters during spin on of the solution would be at ambient pressure temperatures and pressures.

During and after deposition and spinning, a nitrogen gas and water vapor mixture is introduced into the processing chamber at a pressure of 40–100 pascals (Mpa) with this pressure being reduced to ambient pressure during the drying phase, after the pressure has been maintained with nitrogen only the solvents are no longer being used to minimize capillary force.

The description of the preferred embodiment of the present invention has been presented for purposes of illustration and description, but is not intended to be exhaustive or limited to the invention in the form disclosed. Many modifications and variations will be apparent to those of ordinary skill in the art. Aerogels may be created from a number of materials. For example, organic sol-gels include resorcinol-formaldehyde and melamine-formaldehyde. Other silica gels include hydrosilsesquioxane, as well as silica-titania complexes. The embodiment was chosen and described in order to best explain the principles of the invention and the practical application to enable others of ordinary skill in the art to understand the invention for various embodiments with various modifications as are suited to the particular use contemplated.

What is claimed is:

1. A method for forming a dielectric layer comprising:
   depositing a dielectric precursor solution onto a surface of a substrate;
   spinning the substrate to spread the dielectric precursor solution over the surface of the substrate;
   introducing a catalyst through a filter, wherein the filter causes a substantially homogenous distribution of the catalyst within the dielectric precursor solution, wherein a dielectric layer forms containing pores and wherein a solvent is contained in the pores; and
   drying the dielectric layer using a carrier gas after introducing the catalyst, wherein the carrier gas places a positive pressure within the pores while removing the solvent to form a low-k dielectric layer.

2. The method of claim 1, wherein the ratio of carrier gas includes a vapor and an inert gas and the ratio of the inert gas to vapor is changed to increase an amount of inert gas to maintain a constant capillary pressure within the pores.

3. The method of claim 1, further comprising:
   annealing the substrate drying the solution.

4. The method of claim 1, wherein the catalyst is an acid catalyst.

5. The method of claim 4, wherein the acid catalyst is chosen from a group of HCL and $HNO_3$.

6. The method of claim 1, wherein the catalyst is a base catalyst.

7. The method of claim 6, wherein the base catalyst is ammonium fluoride.

8. The method of claim 1, wherein the dielectric precursor solution is $Si(OR)_4$, wherein R is a solvent.

9. The method of claim 8, wherein R is selected from a group of ethanol and methanol.

10. The method of claim 1, wherein the dielectric layer is an aerogel dielectric layer.

11. The method of claim 1, wherein the catalyst is introduced through a filter made of a mesh vapor distribution unit.

12. The method of claim 1, wherein the pores have a range in size from 0.1 microns to 1.0 microns.

13. The method of claim 1, wherein the catalyst is an anhydrous HF.

14. The method of claim 1, wherein the substrate is a semiconductor substrate.

15. The method of claim 1, wherein the substrate is a silicon substrate.

16. The method of claim 1, wherein the substrate is a germanium substrate.

17. A method for forming a silicon dioxide layer in a single processing apparatus comprising:

depositing a silica precursor solution onto a surface of a substrate;

spinning the substrate to spread the solution over the surface of the substrate;

introducing a catalyst through a filter, wherein the filter causes a substantially homogenous distribution of the catalyst within the substrate, wherein a dielectric layer forms containing pores.

18. The method of claim 17, wherein a solvent is contained in the pores and further comprising:

drying the silica precursor solution to form the silicon dioxide layer using a carrier gas after introducing the catalyst, wherein the carrier gas places a positive pressure within the pores while removing the solvent to form a low-k dielectric layer.

19. The method of claim 17, wherein the catalyst is an acid catalyst.

20. The method of claim 19, wherein the acid catalyst is chosen from a group of HCL and $HNO_3$.

21. The method of claim 17, wherein the catalyst is a base catalyst.

22. The method of claim 21, wherein the base catalyst is ammonium fluoride.

23. The method of claim 17, wherein the silica precursor is $Si(OR)_4$, wherein R is a solvent.

24. The method of claim 23, wherein R is selected from a group of ethanol and methanol.

25. The method of claim 17, wherein the dielectric layer is an aerogel dielectric layer.

* * * * *